United States Patent
Kuo et al.

(10) Patent No.: US 9,370,854 B2
(45) Date of Patent: Jun. 21, 2016

(54) METHOD OF FABRICATING A SEMICONDUCTOR DEVICE, AND CHEMICAL MECHANICAL POLISH TOOL

(71) Applicant: Taiwan Semiconductor Manufacturing CO., LTD., Hsinchu (TW)

(72) Inventors: Han-Hsin Kuo, Tainan (TW); Fu-Ming Huang, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 45 days.

(21) Appl. No.: 14/079,008

(22) Filed: Nov. 13, 2013

(65) Prior Publication Data

US 2015/0132948 A1    May 14, 2015

(51) Int. Cl.
*B24B 37/34* (2012.01)
*H01L 21/67* (2006.01)
*H01L 21/768* (2006.01)

(52) U.S. Cl.
CPC ........ *B24B 37/345* (2013.01); *H01L 21/67219* (2013.01); *H01L 21/76826* (2013.01); *H01L 21/76829* (2013.01); *H01L 21/76835* (2013.01); *H01L 21/76883* (2013.01)

(58) Field of Classification Search
CPC ................. H01L 21/3212; H01L 2224/03616; H01L 2224/03845; H01L 2224/11616; H01L 2224/11845; H01L 2224/27616; H01L 2224/27845

USPC ........................................................ 438/633
See application file for complete search history.

(56) References Cited

U.S. PATENT DOCUMENTS

| | | | |
|---|---|---|---|
| 2005/0032293 A1* | 2/2005 | Clark et al. | 438/222 |
| 2005/0093156 A1* | 5/2005 | Naruse et al. | 257/751 |
| 2007/0152252 A1* | 7/2007 | Buehler | H01L 21/02074 257/295 |
| 2012/0196443 A1* | 8/2012 | Deng | 438/693 |
| 2014/0256133 A1* | 9/2014 | Devarapalli et al. | 438/691 |

* cited by examiner

*Primary Examiner* — Daniel Whalen
*Assistant Examiner* — Suberr Chi

(57) ABSTRACT

The present disclosure provides a method of fabricating a semiconductor device with metal interconnections and a design of a tool for performing such a method. In one embodiment, a method of fabricating a semiconductor device, the method includes providing a semiconductor substrate, depositing a dielectric layer over the semiconductor substrate, forming at least one trench in the dielectric layer, and forming a metallization layer in the trench and over the dielectric layer. The method further includes performing a chemical mechanical polishing process to planarize the metallization layer and the dielectric layer, performing a surface treatment on the planarized dielectric layer to form a protection layer, cleaning the planarized metallization layer and the treated dielectric layer to remove residue from the chemical mechanical polishing process, and drying the cleaned metallization layer and dielectric layer in an inert gas environment.

15 Claims, 11 Drawing Sheets

METHOD OF FABRICATING A SEMICONDUCTOR DEVICE, AND CHEMICAL MECHANICAL POLISH TOOL

BACKGROUND

In the increase of the device density on a chip, the metal interconnections also increases and occupy a large portion of the area of the chip. As a result, interconnection-related propagation delays occur more frequently with the increasing amounts of the interconnections within the limited area of the chip. To address this issue is using a multilevel interconnection scheme where interconnections are made through vias in the different dielectric layers isolating various levels of the interconnections. For the implementation of such a scheme, it is important that each level be well planarized so as to make vertical interconnections through lithography and patterning process.

Chemical mechanical planarization (CMP) is a common technique for polishing and thus planarizing the surface of a wafer using chemical slurries and mechanical abrasion. The CMP process is normally used to planarize copper metallization performed over the surface of the wafer, so that only copper deposited inside contact and via openings for interconnects remains. To succeed in conducting the CMP process, a good post-chemical mechanical planarization cleaning process is important. A popular method for the cleanup is to scrub the polished surface with a diluted chemical solution, such as alkaline solutions which remove particles effectively.

On the other hand, Low k dielectric layers are one of the promising candidates for isolating various levels of interconnections. However, in spite of their excellent electrical properties like k-value, leakage current and break down voltage, some of material properties of the low k dielectric layers, e.g., being hydrophilic and porous, result in metal ions from post-chemical mechanical planarization cleaning process attached on surfaces of the dielectric layers. Therefore, the intrinsic breakdown strengths of the low k dielectric layers are reduced due to the residual of the conductive metal ions, which degrades the electrical properties such as the voltage breakdown (Vbd) and the time dependent dielectric breakdown (TDDB) of the semiconductor devices with the low k dielectric layers. With the aggressive shrinkage of the interconnect pitch size in the chip, this problem becomes further exacerbated due to continuous technology scaling. Accordingly, improvements in methods of fabricating a semiconductor device with metal interconnections and corresponding designs of tools continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a", "an" and "the" used herein include plural referents unless the context clearly dictates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventionally, post-chemical mechanical planarization cleaning process is performed right after the chemical mechanical planarization process. However, while alkaline solutions are increasingly adopted as cleaning solutions of the post-chemical mechanical planarization cleaning process, and low k dielectric layers are also applied for isolating various levels of interconnections, degradations of electrical properties such as the voltage breakdown (Vbd) and the time dependent dielectric breakdown (TDDB) of the semiconductor devices occur. In this regard, a method of fabricating a semiconductor device with metal interconnections and a design of a tool for performing the method are provided according to various embodiments of the present disclosure.

Figure 1:
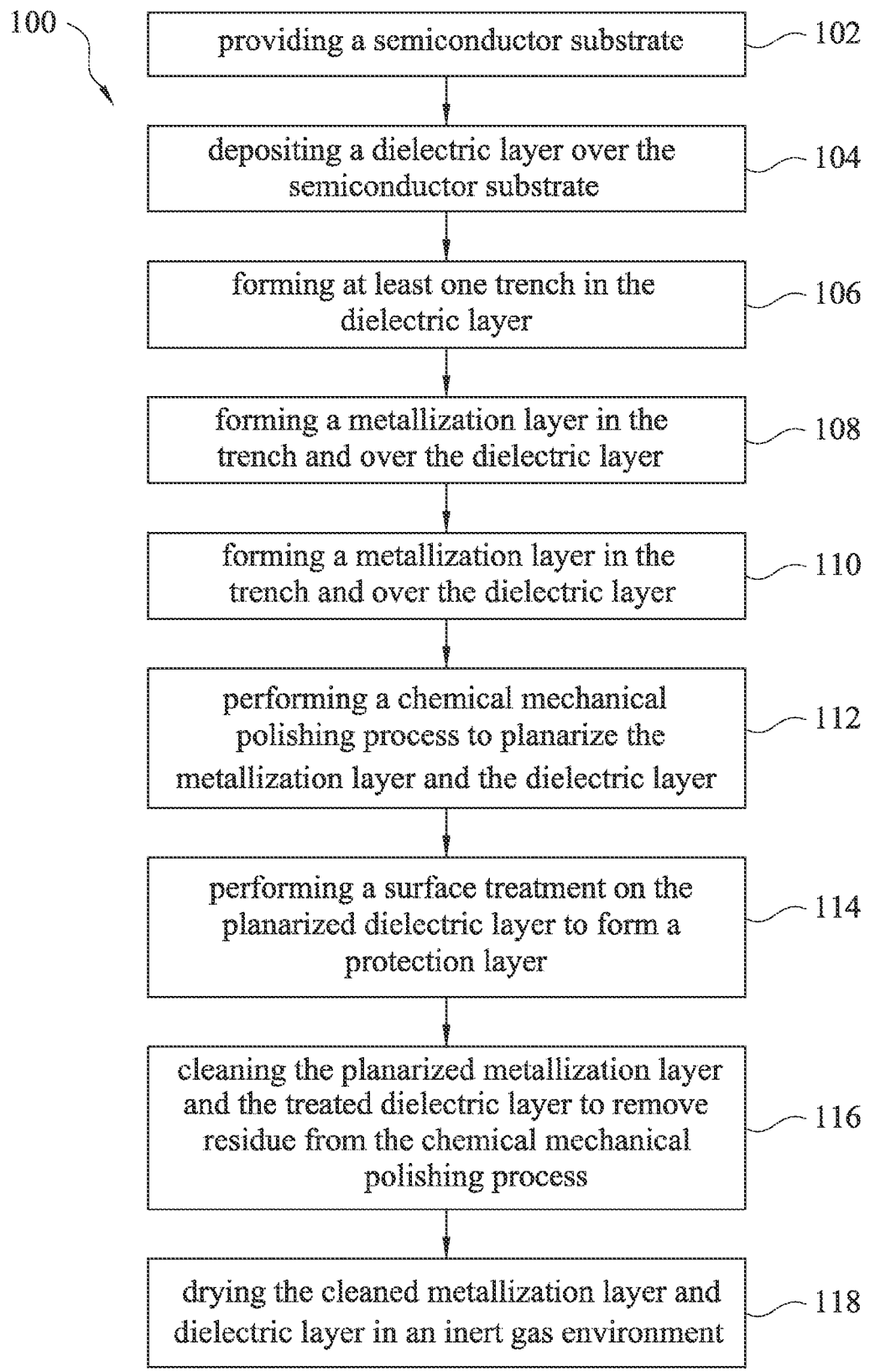
FIG. 1 is a flowchart illustrating a method of fabricating a semiconductor device according to various embodiments of the present disclosure.

Referring to FIG. 1, FIG. 1 is a flowchart illustrating a method of fabricating a semiconductor device according to various embodiments of the present disclosure. The method 100 begins with block 102 in which a semiconductor substrate is provided. The semiconductor substrate is, for example, an integrated circuit wafer including NMOS devices and/or PMOS devices. The method continues with block 104 in which a dielectric layer is deposited over the semiconductor substrate. Next, the method includes forming at least one trench in the dielectric layer as shown in block 106. In various embodiments of the present disclosure, after the operation of depositing a dielectric layer over the substrate, further comprising forming at least one via in the dielectric layer. The operation of forming at least one via may be performed before or after that of forming at least one trench. In various embodiments of the present disclosure, the operation of forming at least one via and the operation of forming at least one trench in the dielectric layer are performed simultaneously by double patterning. The method 100 continues with block 108 in which a metallization layer is formed in the trench and over the dielectric layer. Next, the method includes performing a chemical mechanical polishing process to planarize the metallization layer and the dielectric layer as shown in block 110, for example, performing in a chemical mechanical polishing unit in a chemical mechanical polishing tool. The method 100 continues with block 112 in which a surface treatment is performed on the planarized dielectric layer, for example, the surface treatment is performed in a surface treating unit in the chemical mechanical polishing tool. Next, the method includes cleaning the planarized metallization layer and the treated dielectric layer to remove residue from the chemical mechanical polishing process as shown in block 114, for example, the operation of cleaning is performed in a cleaning unit of the chemical mechanical polishing tool. The method 100 continues with block 116 in which the cleaned metallization layer and dielectric layer are dried in an inert gas environment, for example, the operation of drying is performed in a drying unit in the chemical mechanical polishing tool.

The method for fabricating a semiconductor device according to various embodiments of the present disclosure will now be described in conjunction with FIG. 2-10.

Figure 2:
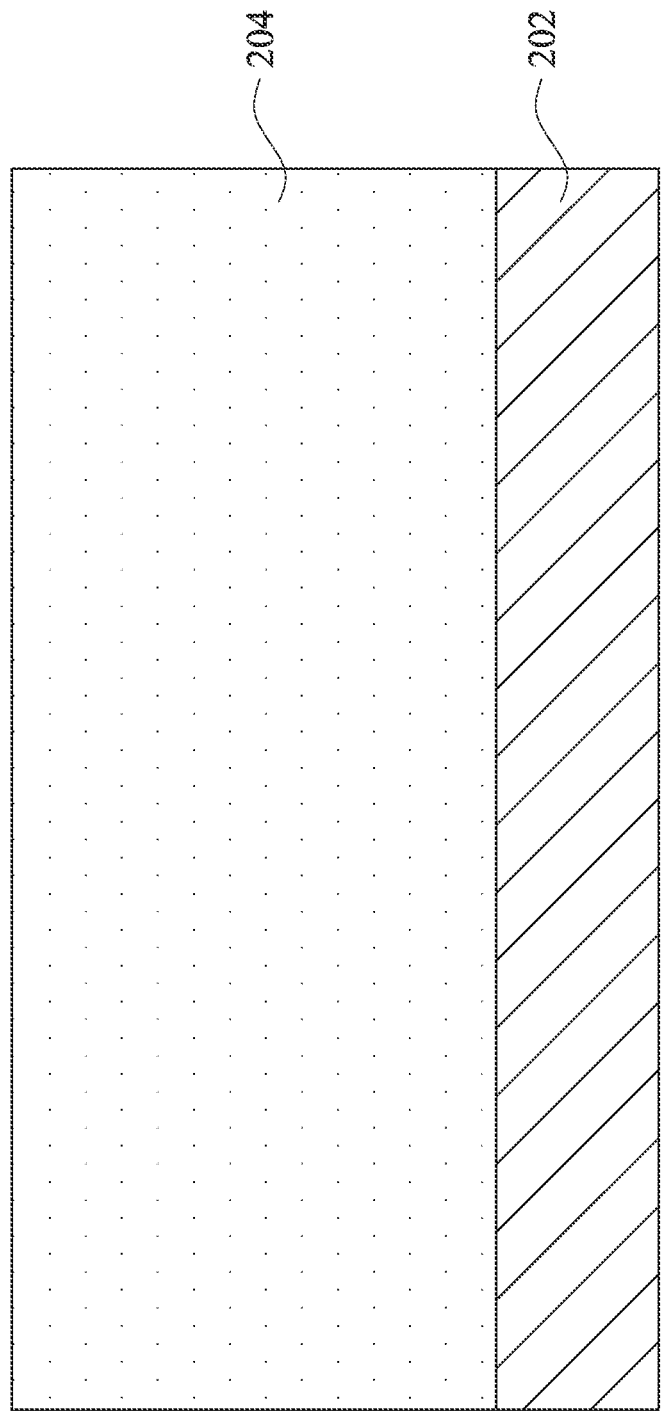
FIG. 2 is a schematic view of at least a portion of the semiconductor device in an intermediate stage of manufacture according to various embodiments of the present disclosure.

Referring to FIG. 2, FIG. 2 is a schematic view of at least a portion of a semiconductor device in an intermediate stage of manufacture according to various embodiments of the present disclosure. A semiconductor substrate 202 is provided. The substrate 202 may be comprised of silicon material or alternatively may include silicon germanium, gallium arsenic, or other suitable semiconductor materials. The substrate 202 may further include doped regions such as a P-well and/or an N-well (not shown). The substrate 202 may also include other features such as a buried layer, and/or an epitaxy layer. Furthermore, the substrate 202 may be a semiconductor on insulator such as silicon on insulator (SOI). In other embodiments, the semiconductor substrate 202 may include a doped epitaxy layer, a gradient semiconductor layer, and/or may further include a semiconductor layer overlying another semiconductor layer of a different type, such as a silicon layer on a silicon germanium layer. In other examples, a compound semiconductor substrate may include a multilayer silicon structure or a silicon substrate may include a multilayer compound semiconductor structure. The active region may be configured as an NMOS device (e.g., nFET) or a PMOS device (e.g., pFET) in one example. As illustrated in FIG. 2, a dielectric layer 204 is deposited over the semiconductor substrate 202. The dielectric layer 204 may be formed by suitable processes, such as CVD, PVD, ALD, HDPCVD, MOCVD, RPCVD, PECVD, PLD, other suitable techniques, or combinations thereof. In various embodiments of the present disclosure, the dielectric layer 204 is a low-k dielectric layer. The low-K dielectric is a material with a small dielectric constant relative to silicon dioxide. As components have scaled and transistors have got closer together in the semiconductor device, the insulating dielectrics have thinned to the point where charge build up and crosstalk adversely affect the performance of the semiconductor device. Replacing the silicon dioxide with a low-K dielectric of the same thickness reduces parasitic capacitance, enabling faster switching speeds and lower heat dissipation. The low-k dielectric layer may be silicon dioxide, or a low-k dielectric material or a ultra low k material, such as borophosphosilicate glass (BPSG), borosilicate glass (BSG), phosphosilicate glass (PSG), fluorinated silica glass (FSG), SiLK, BLACK DIAMOND, and the like. In various embodiments of the present disclosure, the dielectric layer 204 is formed from porous carbon-doped silicon dioxide.

Figure 3:
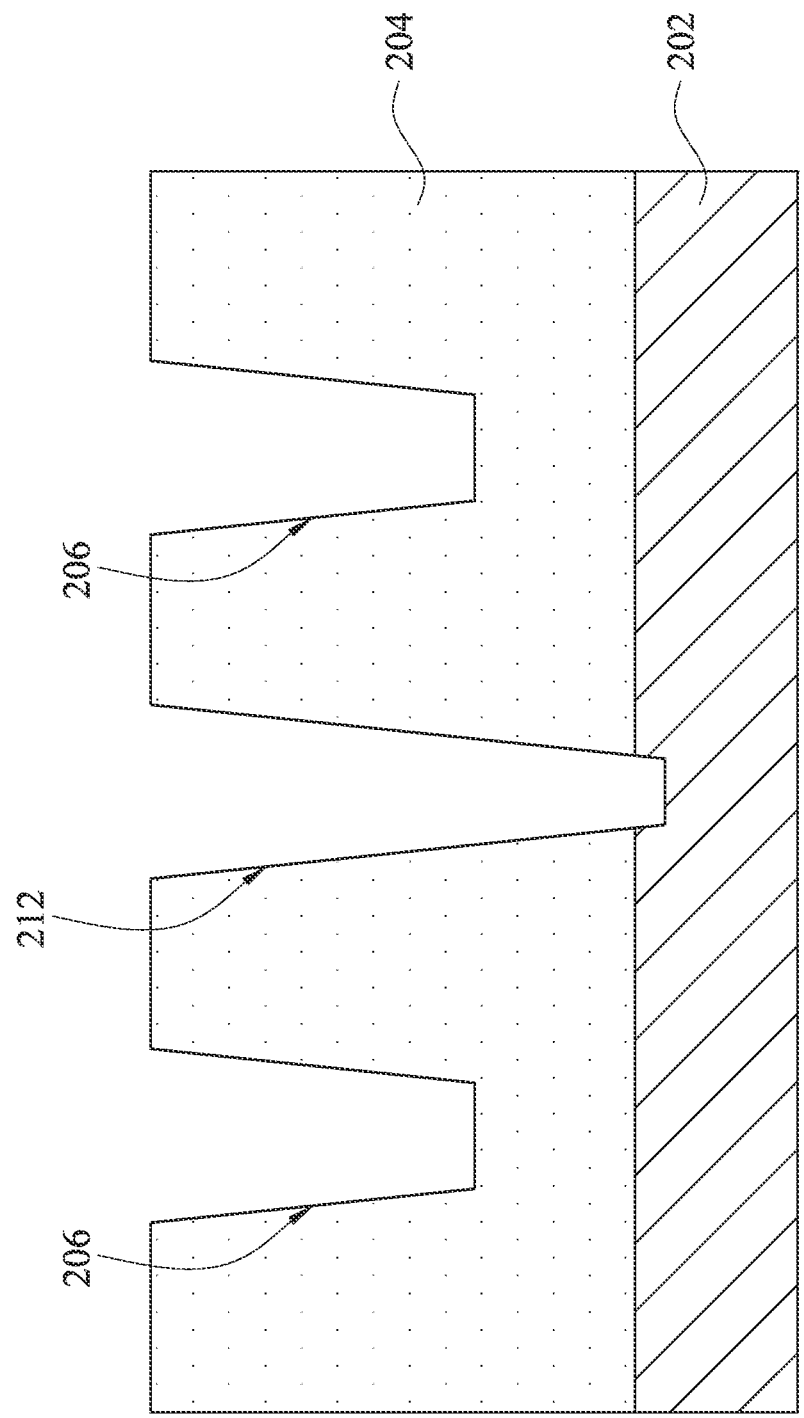
FIG. 3 is a schematic view of the semiconductor device shown in FIG. 2 in a subsequent stage of manufacture according to various embodiments of the present disclosure.

Referring to FIG. 3, FIG. 3 is a schematic view of the semiconductor device shown in FIG. 2 in a subsequent stage of manufacture according to various embodiments of the present disclosure. At least one trench 206 is formed in the dielectric layer. The trench 206 is a space in the dielectric layer 204 for conductive materials, e.g., metals, to fulfill therein following operations. As illustrated in FIG. 3, in various embodiments of the present disclosure, at least one via 212 is formed in the dielectric layer. The via 212 is also a space in the dielectric layer 204 for conductive materials, e.g., metals, to fulfill therein following operations. The trench 206 is the space in the dielectric layer for forming conductor in one level of interconnection; the via 212 is the space in the dielectric layer for forming electrical connections between different levels of interconnection. Therefore a structure for forming a dual damascene is formed. The dual damascene process scheme is used to fabricate of interconnects with trenches and vias. The dual damascene interconnects can be formed by depositing the dielectric layer 204 on the substrate 202, patterning it using photolithography and dielectric reactive ion etch (RIE), then filling the recesses (the trenches and/or the vias 212) with conductive materials in the following operation. The operation of forming at least one via 212 in the dielectric layer 204 may be followed by the operation of forming at least one trench 206 in the dielectric layer 204 (via first), or vice versa (trench first). In some embodiments of the present disclosure, the operation of forming at least one via 212 and the operation of forming at least one trench 206 in the dielectric layer 204 are performed simultaneously by double patterning.

Figure 4:
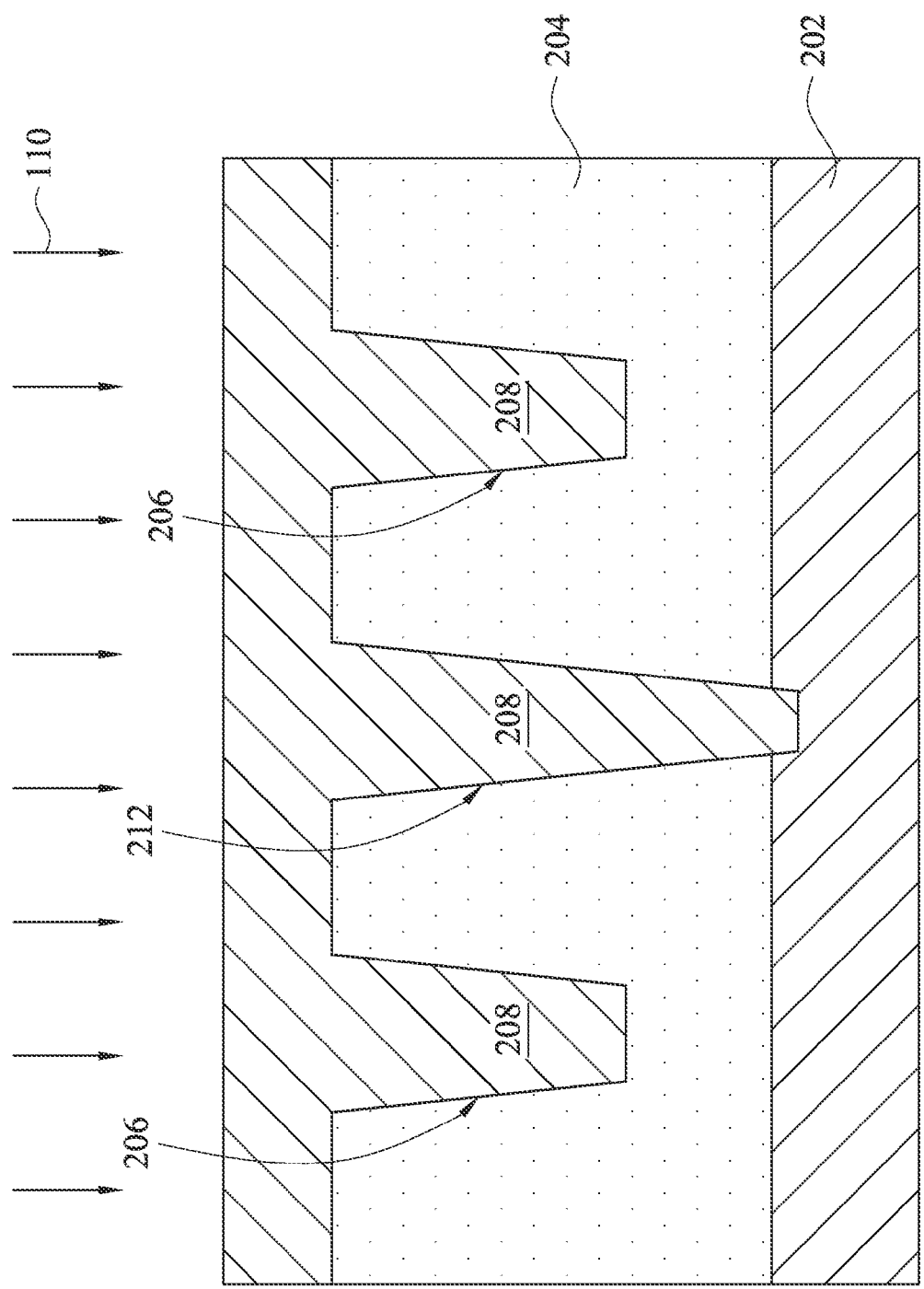
FIG. 4 is a schematic view of the semiconductor device shown in FIG. 3 in a subsequent stage of manufacture according to various embodiments of the present disclosure.
Figure 5:
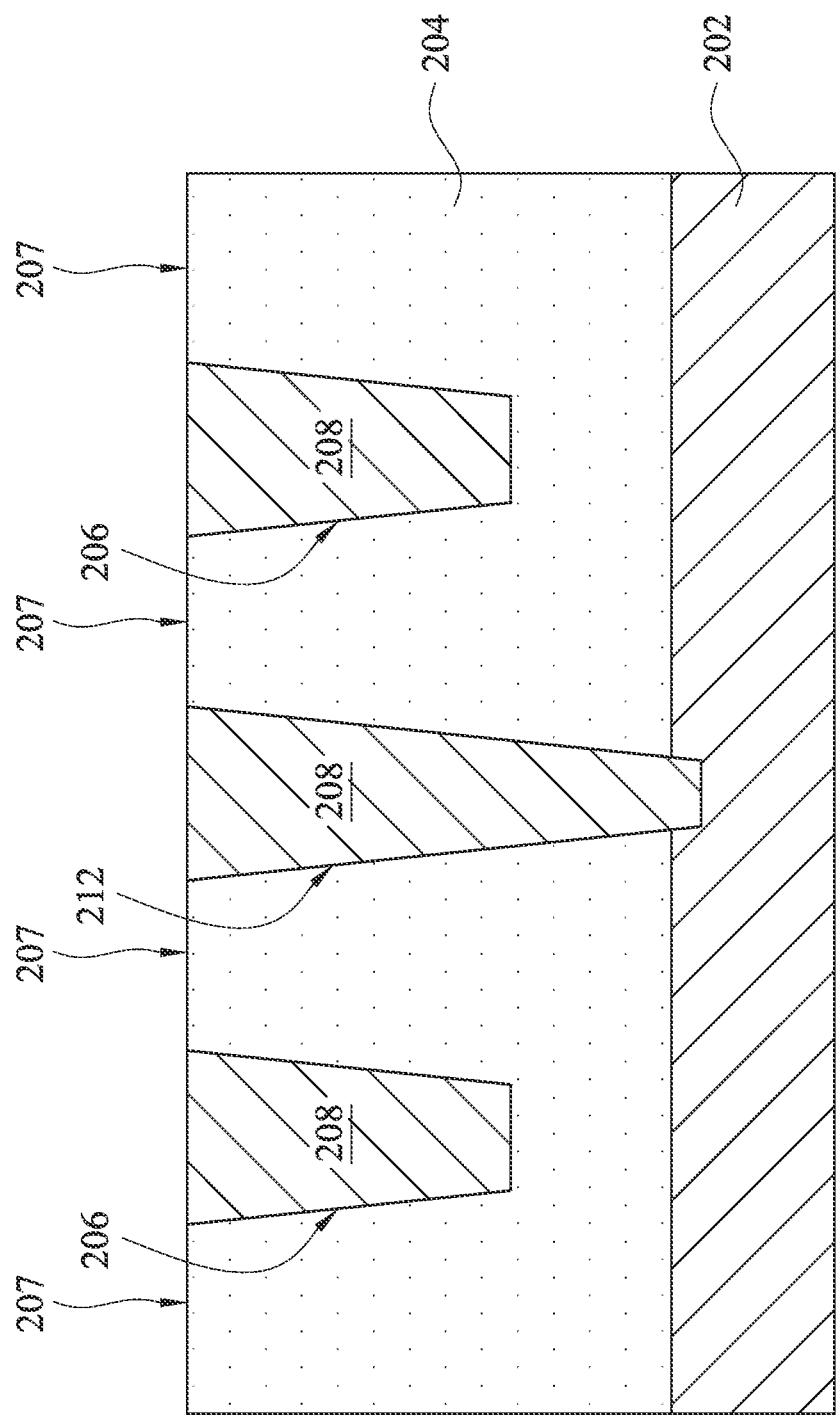
FIG. 5 is a schematic view of the semiconductor device shown in FIG. 4 in a subsequent stage of manufacture according to various embodiments of the present disclosure.

Referring to FIG. 4 and FIG. 5, FIG. 4 is a schematic view of the semiconductor device shown in FIG. 3 in a subsequent stage of manufacture according to various embodiments of the present disclosure; FIG. 5 is a schematic view of the semiconductor device shown in FIG. 4 in a subsequent stage of manufacture according to various embodiments of the present disclosure. As illustrated in FIG. 4, a metallization layer 208 is formed in the trench 206 and over the dielectric layer 204. The metallization layer 208 may be comprised of aluminum (Al), tungsten (W), copper (Cu), or other suitable metal material deposited by CVD, PVD, electrochemical plating (ECP), or other suitable process. In various embodiments of the present disclosure, the metallization layer 208 is copper. As illustrated in FIG. 4, in various embodiments of the present disclosure, the via 212 is also form in the dielectric layer 204, the metallization layer 208 is formed in the trench 206, the via 212 and over the dielectric layer 204. In addition, a barrier layer (not shown) is optionally formed in the trench 206 and over the dielectric layer 204 before the metallization layer 208 is formed, so as to further prevent metal diffusion between the metallization layer 208 and the dielectric layer 204 which would degrade electrical properties of the semiconductor device. The barrier layer may be comprised of tantalum (Ta), tantalum nitride (TaN), titanium (Ti), titanium nitride (TiN), or alloys thereof deposited by atomic layer deposition (ALD), plasma vapor deposition (PVD), CVD, or other suitable process. Next, a chemical mechanical polishing process 110 is performed to planarize the metallization layer 208 and the dielectric layer 204. The chemical mechanical polishing process 110 is performed on metallization layer 208, and the dielectric to remove excess metal (e.g., metal above the trenches 206 and/or the vias 212). The chemical mechanical polishing process 110 may be used, such as mounting the wafer on a rotating holder and lowering the wafer onto a table head surface rotating in the opposite direction. A slurry suspended in a mild etchant, such as potassium or ammonium hydroxide, may then be applied to the table head surface. The slurry may be used for chemical mechanical polishing process 110, including ferric nitrate, peroxide, potassium iodate, ammonia, silica, alumina, and other suitable materials. The rotating wafer is pressed face-down against the rotating polishing pad and the slurry is pressed against the face of the wafer by the table head surface. As illustrated in FIG. 5, after the chemical mechanical polishing process 110 is performed, a coplanar top surface of each of the metallization layer 208 and the dielectric layer 204 is formed. The coplanar top surface includes exposed surfaces 207 of the planarized dielectric layer 204.

Figure 6:
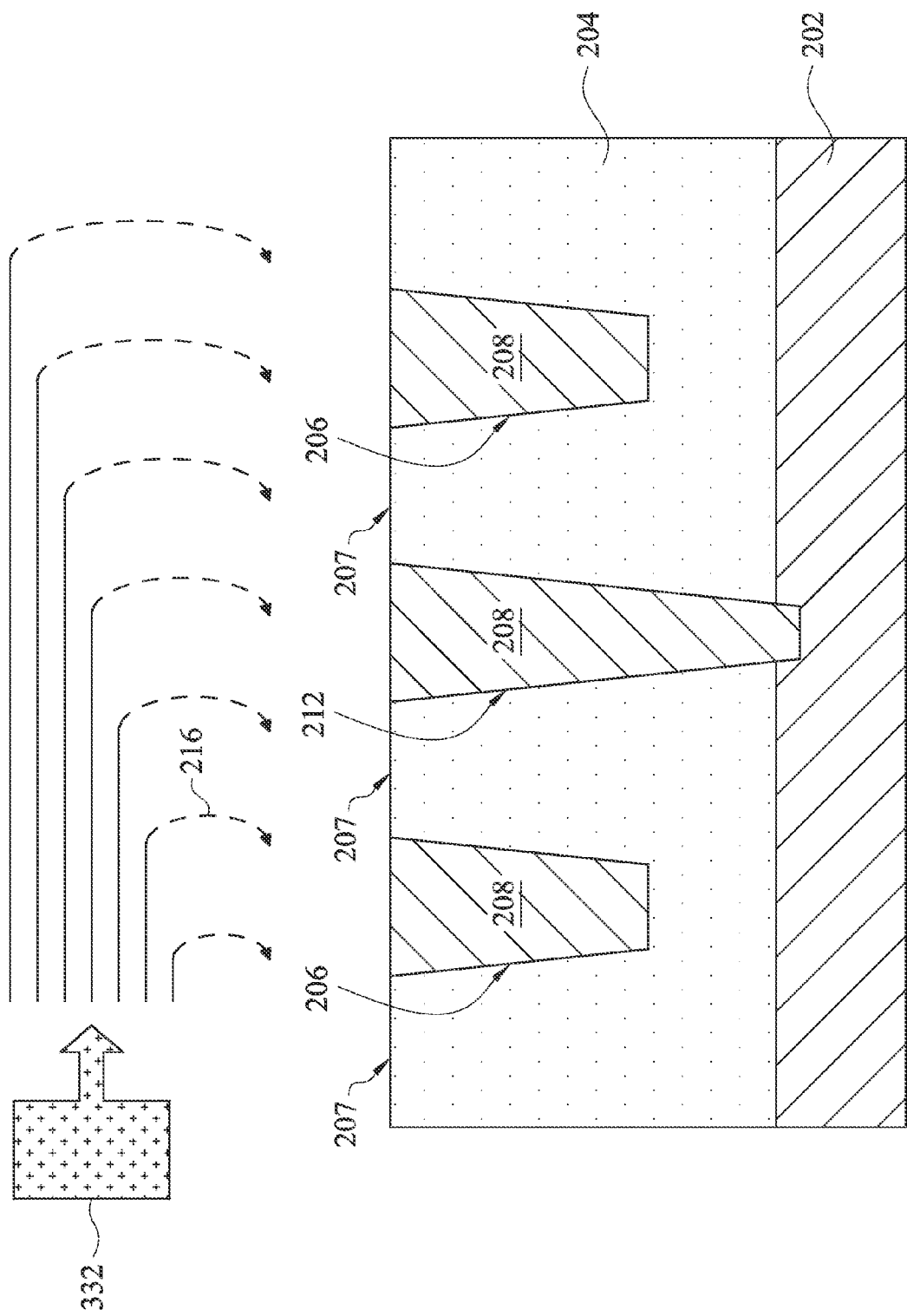
FIG. 6 is a schematic view of the semiconductor device shown in FIG. 5 in a subsequent stage of manufacture according to various embodiments of the present disclosure.

Referring to FIG. 6, FIG. 6 is a schematic view of the semiconductor device shown in FIG. 5 in a subsequent stage of manufacture according to various embodiments of the present disclosure. A surface treatment is performed on the planarized dielectric layer 204 to form a protection layer. As illustrated in FIG. 6, in various embodiments of the present disclosure, the surface treatment is performed by injecting a surface treating vapor 216 on the exposed surfaces 207 of the planarized dielectric layer 204. The operation of performing the surface treatment 112 may be performed in another unit of the chemical mechanical polishing tool where performing aforementioned chemical mechanical polishing process 110. That is, the operation of performing the surface treatment 112 and the operation of chemical mechanical polishing process 110 may be performed in one tool as in-situ process sequences. For example, the wafer is transferred to a surface treatment unit when finished the chemical mechanical polishing process 110 in a chemical mechanical polishing unit. As illustrated in FIG. 6, a surface treating vapor supply 332 of the surface treatment unit injects the surface treating vapor 216 on the exposed surfaces 207 of the planarized dielectric layer 204 to form a protection layer. In various embodiments of the present disclosure, the surface treating vapor 216 includes hexamethyldisilazane (HMDS). The details of the formation of the protection layer, and the reaction between the exposed surfaces 207 of the planarized dielectric layer 204 and the surface treating vapor 216 are described in following paragraphs of the present disclosure.

Figure 7:
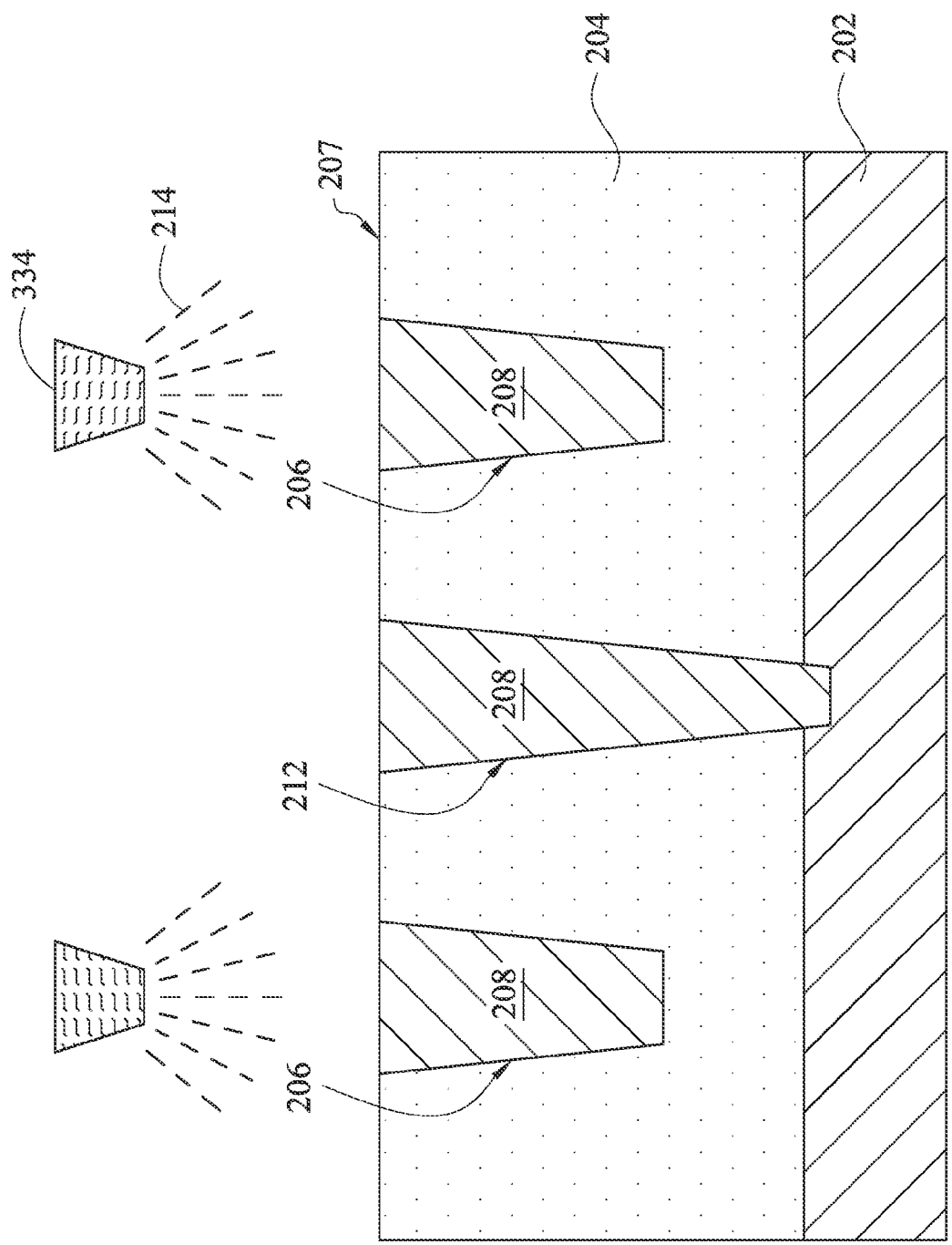
FIG. 7 is a schematic view of the semiconductor device shown in FIG. 5 in a subsequent stage of manufacture according to various embodiments of the present disclosure.

Referring to FIG. 7, FIG. 7 is also a schematic view of the semiconductor device shown in FIG. 5 in a subsequent stage of manufacture according to other various embodiments of the present disclosure. As illustrated in FIG. 7, the surface treatment 112 is performed by spraying a surface treating solution 214. The operation of performing the surface treatment 112 also may be performed in another unit of the chemical mechanical polishing tool where performing aforementioned chemical mechanical polishing process 110. That is, the operation of performing the surface treatment 112 and the operation of chemical mechanical polishing process 110 may be performed in one tool as in-situ process sequences. For example, the wafer is transferred to a surface treatment unit when finished the chemical mechanical polishing process 110 in a chemical mechanical polishing unit. As illustrated in FIG. 7, spray nozzles 334 of the surface treatment unit sprays the surface treating solution 214 on the exposed surfaces 207 of the planarized dielectric layer 204 to form a protection layer. In various embodiments of the present disclosure, the surface treating solution 214 comprises N,N-Diethyl-1,1,1-trimethylsilylamine (TMSDEA), trimethylsilylacetate (OTMSA), or a mixture thereof. The details of the formation of the protection layer, and the reaction between the exposed surfaces 207 of the planarized dielectric layer 204 and the surface treating solution 214 are described in following paragraphs of the present disclosure.

Figure 8:
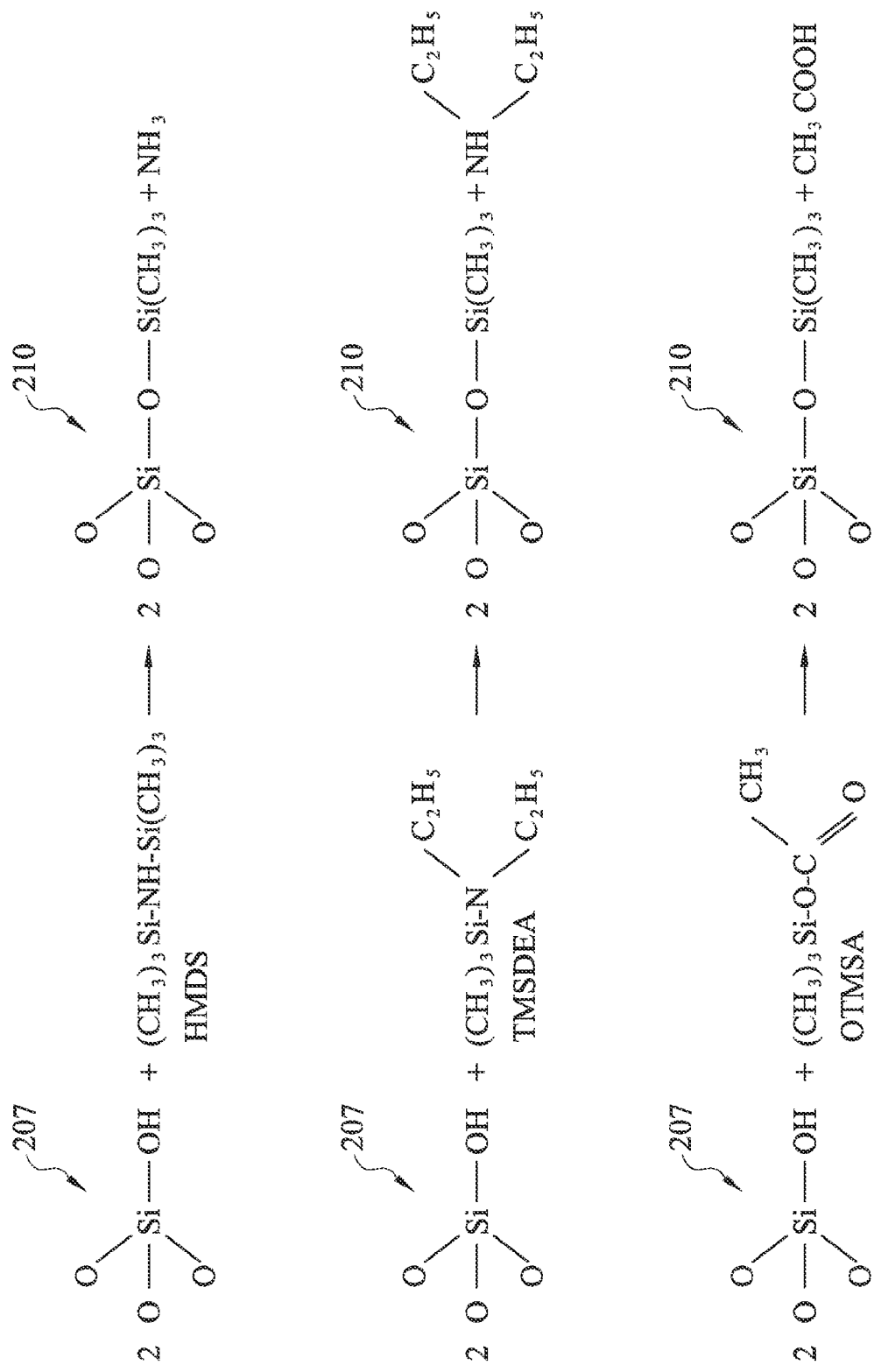
FIG. 8 illustrates the chemical formulations regarding the formation of the pore-sealing layer according to various embodiments of the present disclosure.

FIG. 8 illustrates the chemical formulas regarding the formation of the protection layer according to various embodiments of the present disclosure. As illustrated in FIG. 8, the exposed surfaces 207 of the planarized dielectric layer 204 are surface treated by the surface treating vapor 216, for example, hexamethyldisilazane (HMDS) or the surface treating solution 214, for example, N,N-Diethyl-1,1,1-trimethylsilylamine (TMSDEA), trimethylsilylacetate (OTMSA). Therefore, the silanols (Si—OH) of the exposed surfaces 207 are reacted to yield trimethylsilyl (—Si(CH$_3$)$_3$) surface groups, and the protection layers 210 are formed. Low k dielectric layers are one of the promising candidates for intermetal and interlevel dielectrics in copper metallization. However, in spite of their electrical properties like k-value, leakage current and break down voltage are regarded as excellent, they are hydrophilic due to their silanol groups on the surfaces (as shown in FIG. 8). It results that metal ions, for example, K$^+$ from the aqueous solution, for example, KOH solution in the following cleaning process 114 after the chemical mechanical polishing process 110 would be absorbed on the exposed surfaces 207 of the planarized dielectric layer 204. Therefore, the intrinsic breakdown strengths of the low k dielectric layers are weakened due to the conductive metal ions, so as to degrade the electrical properties such as the voltage breakdown (Vbd) and the time dependent dielectric breakdown (TDDB) of the semiconductor devices with them. It should be noticed that the surface treatment 112 is inserted between the chemical mechanical polishing process 110 and the cleaning process 114 according to various embodiments of the present disclosure. As illustrated in FIG. 8, the silanols (Si—OH) of the exposed surfaces 207 are reacted to yield trimethylsilyl (—Si(CH$_3$)$_3$) surface groups, therefore the hydrophilic characteristic of the low k dielectric layers due to their silanol (Si—OH) groups on the surfaces is transformed into hydrophobic due to their trimethylsilyl (—Si(CH$_3$)$_3$) groups on the surfaces. Besides, the trimethylsilyl (—Si(CH$_3$)$_3$) surface groups also lead the protection layer 210 a dense thin film, and leave few pores for metal ions to residue thereon. In various embodiments of the present disclosure, the low-k dielectric layer 204 is formed from porous carbon-doped silicon dioxide and the protection layer 210 is a pore-sealing layer. Therefore, the concern caused by absorption of metal ions from the following cleaning process is eliminated. Accordingly, electrical properties such as the voltage breakdown (Vbd), the time dependent dielectric breakdown (TDDB) and reliability of the semiconductor devices with them can be further improved.

Figure 9:
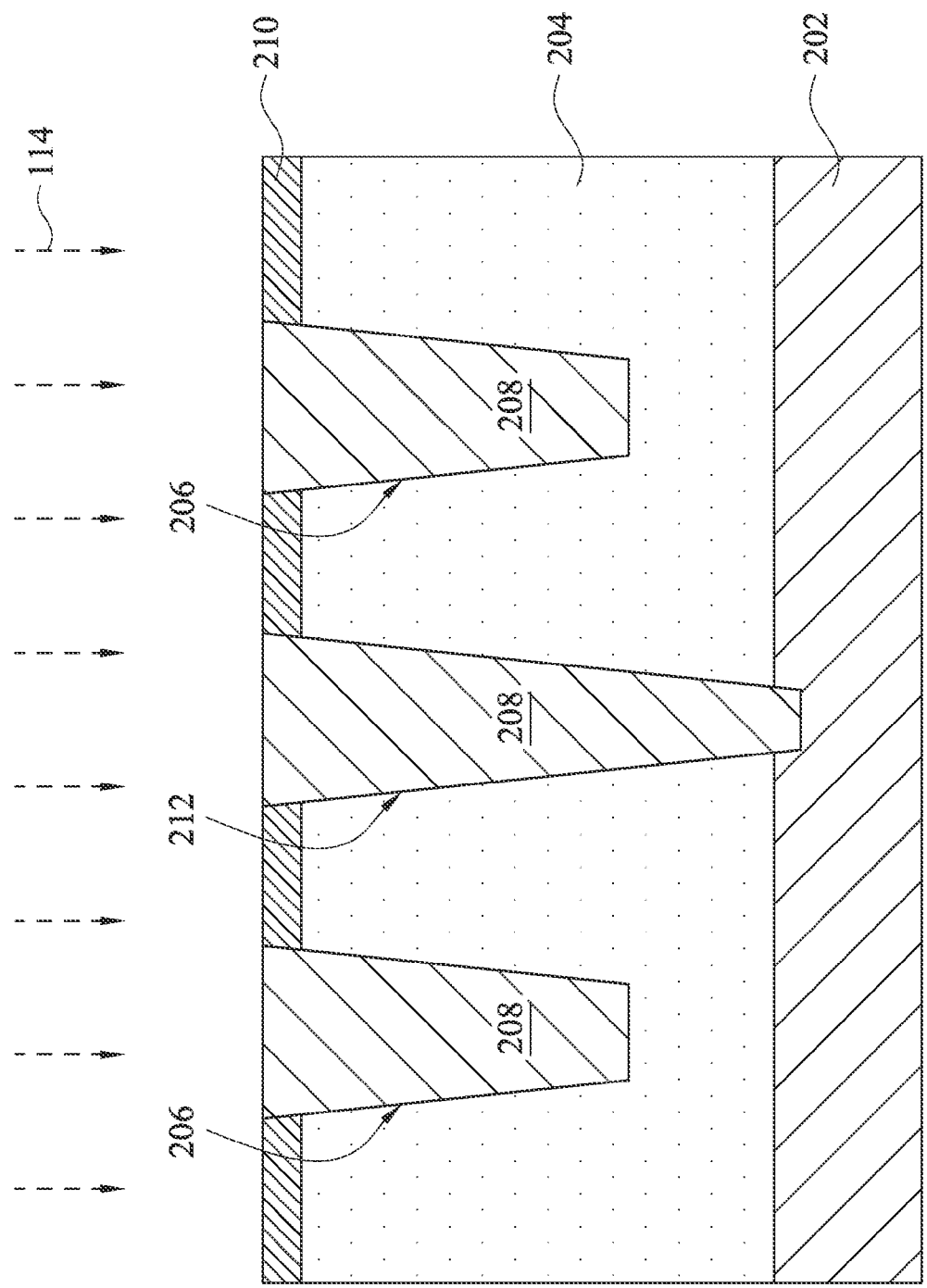
FIG. 9 is a schematic view of the semiconductor device shown in FIG. 6 or FIG. 7 in a subsequent stage of manufacture according to various embodiments of the present disclosure.

Referring to FIG. 9, FIG. 9 is a schematic view of the semiconductor device shown in FIG. 6 or FIG. 7 in a subsequent stage of manufacture according to various embodiments of the present disclosure. The planarized metallization layer 208 and the treated dielectric layer 204 are cleaned to remove residue from the chemical mechanical polishing process. As illustrated in FIG. 9, since the protection layers 210 are formed on the exposed surfaces 207 of the planarized dielectric layer 204 in advance, the operation of cleaning the planarized metallization layer and the treated dielectric layer 114 will not impact the planarized dielectric layer 204 directly. In various embodiments of the present disclosure, the operation of cleaning the planarized metallization layer and the treated dielectric layer 114 comprises cleaning the planarized metallization layer and the treated dielectric layer using a base solution. The base solution may be an aqueous solution of KOH, NaOH or a mixture thereof. As aforementioned, since the silanol (Si—OH) groups of the exposed surfaces 207 of the planarized dielectric layer 204 have been transformed into trimethylsilyl (—Si(CH$_3$)$_3$) groups in advance, the concerns of degrading electrical properties such as the voltage breakdown (Vbd), the time dependent dielectric breakdown (TDDB) and reliability of the semiconductor devices which are caused by absorption of metal ions from the present cleaning process is eliminated. In addition, the operation of cleaning the planarized metallization layer and the treated dielectric layer 114, the operation of performing the surface treatment 112 and the operation of chemical mechanical polishing process 110 may be performed in one tool as in-situ process sequences. For example, the wafer is transferred to a surface treatment unit when finished the chemical mechanical polishing process 110 in a chemical mechanical polishing unit, then the wafer is transferred to a cleaning unit when finished the surface treatment 112 in the surface treatment unit.

Figure 10:
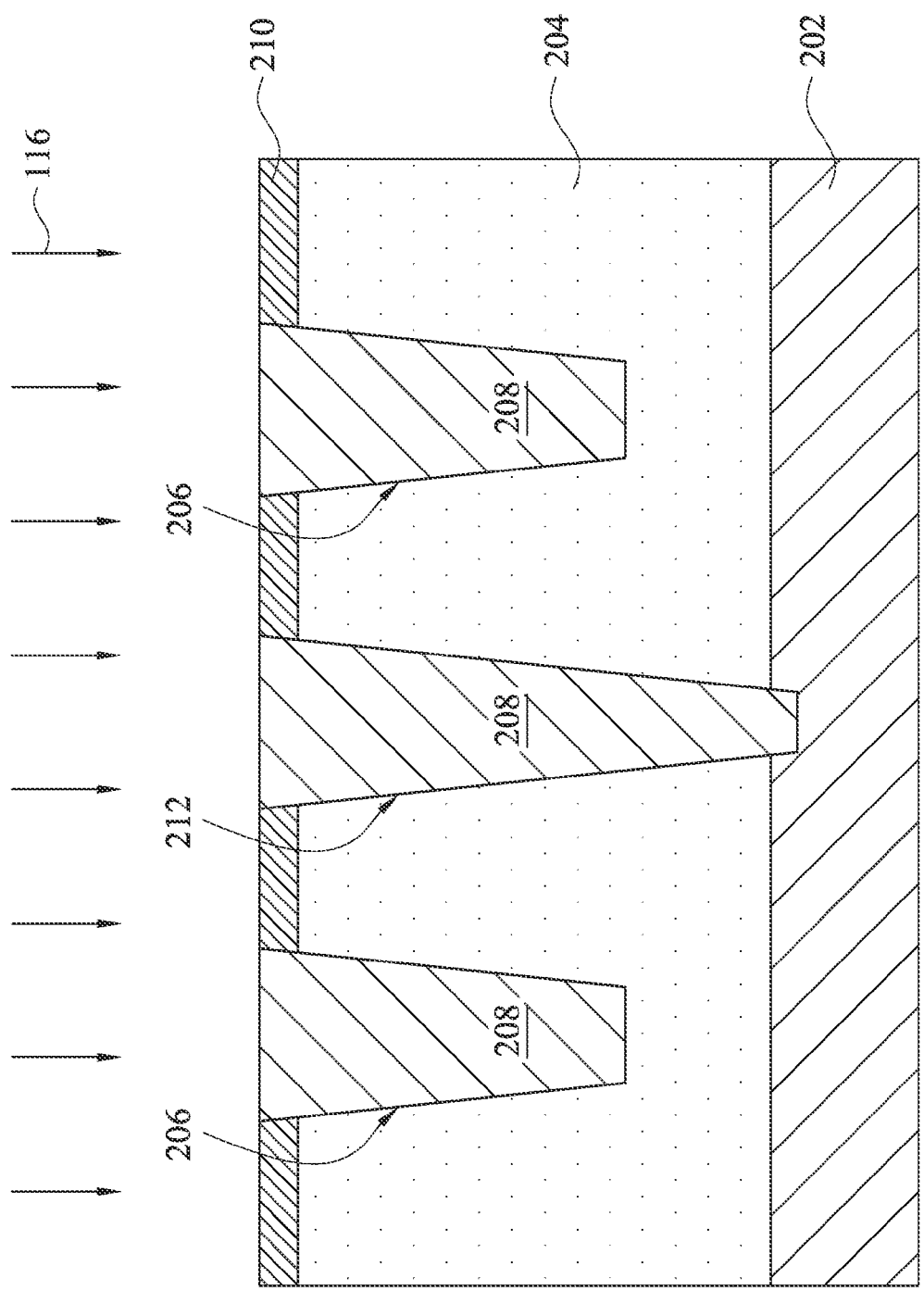
FIG. 10 is a schematic view of the semiconductor device shown in FIG. 9 in a subsequent stage of manufacture according to various embodiments of the present disclosure.

FIG. 10 is a schematic view of the semiconductor device shown in FIG. 9 in a subsequent stage of manufacture according to various embodiments of the present disclosure. The cleaned metallization layer 208 and dielectric layer 204 are dried in an inert gas environment. As illustrated in FIG. 10, the operation of the drying 116 may be performed by vacuum baking or injecting an inert gas vapor to the cleaned metallization layer 208 and dielectric layer 204 in the inert gas environment. In various embodiments of the present disclosure, the inert gas is comprised of nitrogen, helium, argon, or a mixture thereof. Advantageously, drying in the inert gas environment prevents corrosion of the exposed surface of metal layer 208, moisture adhesion onto the exposed surface of the metallization layer 208 from water in the atmosphere (i.e., promotes water desorption), and pitting on the exposed surface of the metallization layer 208, in particular advantageous when a queue time for further processing is increased. In addition, the operation of the drying 116, the operation of cleaning, the operation of performing the surface treatment 112 and the operation of chemical mechanical polishing process 110 may be performed in one tool as in-situ process sequences. For example, the wafer is transferred to a surface treatment unit when finished the chemical mechanical polishing process 110 in a chemical mechanical polishing unit, the wafer is subsequently transferred to a cleaning unit when finished the surface treatment 112 in the surface treatment unit, the wafer is subsequently transferred to a drying unit when finished the operation of cleaning 114 in the cleaning unit, and the wafer is subsequently transferred to a drying unit when finished the operation of drying 116 in the cleaning unit.

In various embodiments of the present disclosure, the chemical mechanical polishing process, the surface treatment, the operation of cleaning the planarized metallization layer and the treated dielectric layer, and the operation of drying the cleaned metallization layer and dielectric layer are performed in a chemical mechanical polishing tool.

Figure 11:
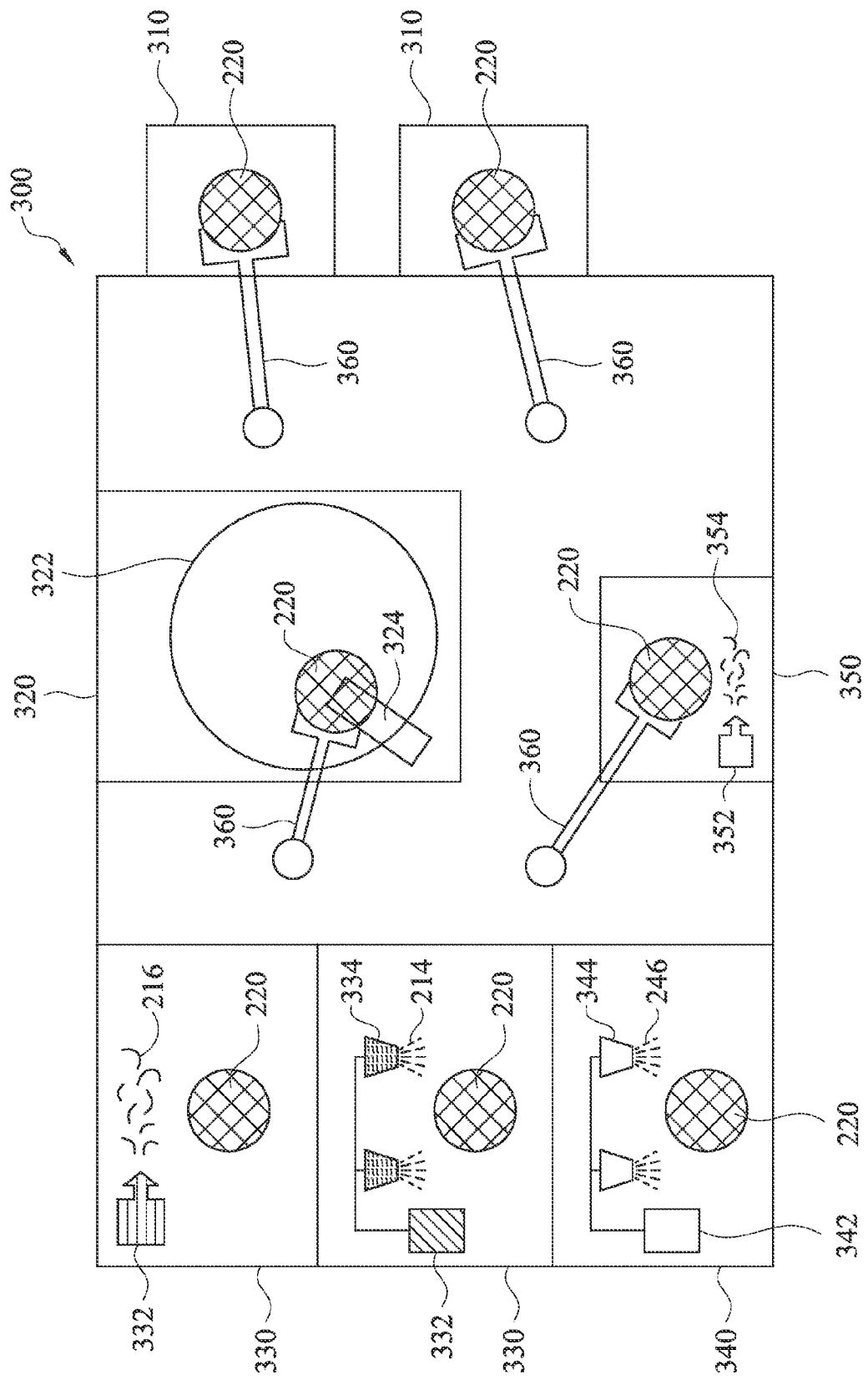
FIG. 11 is a schematic view of a chemical mechanical polishing tool according to various embodiments of the present disclosure.

FIG. 11 is a schematic view of a chemical mechanical polishing tool according to various embodiments of the present disclosure. The chemical mechanical polishing tool 300 includes at least one front opening unified pod 310, at least one chemical mechanical polishing unit 320, at least one surface treating unit 330, at least one cleaning unit 340, and at least one drying unit 350.

The front opening unified pod 310 is configured to receive an integrated circuit wafer 220 including a metal conductor (as 208 shown in FIG. 4) in a trench (as 206 shown in FIG. 4) of a dielectric layer (as 204 shown in FIG. 4) over a substrate (as 202 shown in FIG. 4). The integrated circuit wafer 220 may be transferred into and out of the chemical mechanical polishing tool 300 through the front opening unified pods 310. In some embodiments of the present disclosure, a plurality of front opening unified pods 310 may be included in the chemical mechanical polishing tool 300. As illustrated in FIG. 11, two front opening unified pods 310 are illustrated.

The chemical mechanical polishing unit 320 is operably coupled to the first front opening unified pod 310, and the chemical mechanical polishing unit 320 is configured to perform a chemical mechanical polishing process to planarize the metal conductor and the dielectric layer (as illustrated in FIG. 5). The chemical mechanical polishing unit 320 includes typical instruments and apparatus to perform a chemical mechanical polishing process as known in the art to planarize the metal conductor and the dielectric layer of the integrated circuit wafer 220. As illustrated in FIG. 11, in various embodiments of the present disclosure, chemical mechanical polishing unit 320 may further include a rotating holder 324a for mounting the integrated circuit wafer 220 and lowering the integrated circuit wafer 220 onto a table head surface 323, which is configured to rotate in the opposite direction as the integrated circuit wafer 220, however, the present disclosure is not limited thereto.

The surface treating units 330 are operably coupled to the chemical mechanical polishing unit 320, and the surface treating units 330 are configured to surface treating the planarized dielectric layer to form a protection layer thereon (as illustrated in FIG. 6-8). In various embodiments of the present disclosure, the surface treating unit 330 includes a surface treating vapor supply 332 to inject the surface treating vapor 216 to the planarized dielectric layer of the integrated circuit wafer 220, so as to from the protection layer for avoiding metal ions from the following cleaning operation to attach on. In various embodiments of the present disclosure, the surface treating vapor 216 includes hexamethyldisilazane (HMDS). In other various embodiments of the present disclosure, the surface treating unit 330 includes a surface treating solution supply 332 and spray nozzles 334 to spray the surface treating solution 214 to the planarized dielectric layer of the integrated circuit wafer 220, so as to from the protection layer for avoiding metal ions from the following cleaning operation to attach on. In various embodiments of the present disclosure, the surface treating solution 214 is comprised of N,N-Diethyl-1,1-trimethylsilylamine (TMSDEA), trimethylsilylacetate (OTMSA), or mixtures thereof.

The cleaning unit 340 is operably coupled to the surface treating units 330, the cleaning unit 340 is configured to clean the planarized metal conductor and the treated dielectric layer to remove residue from the chemical mechanical polishing process (as illustrated in FIG. 9). The cleaning unit 340 may include a cleaning solution supply 342 and cleaning nozzles 344 for rinsing the integrated circuit wafer 220 with typical cleaning chemistries, such as a surfactant, an alkaline, and DI water. In various embodiments of the present disclosure, a cleaning solution 246 dispensed by the cleaning nozzles 344 includes KOH. The drying unit 350 is operably coupled to the cleaning unit 340, and the drying unit 350 is configured to dry the cleaned metal conductor and dielectric layer. The drying unit 350 may be in an inert gas environment to prevent corrosion of the exposed metal conductor, and moisture adhesion onto the exposed metal conductor from water in the atmosphere. The drying unit 350 may include a drying vapor supply 352 to injecting a drying vapor 354. In various embodiments of the present disclosure, the chemical mechanical polishing tool 300 further includes a wafer transport mechanism 360 configured to transport the integrated circuit wafer 220 between the units.

It should be noticed that the surface treatment 112 is inserted between the chemical mechanical polishing process 110 and the cleaning process 114 according to various embodiments of the present disclosure. The operation of chemical mechanical polishing process, the operation of performing the surface treatment, the operation of cleaning, and the operation of the drying may be performed in corresponding units 320, 330, 340, and 350 of the chemical mechanical polishing tool 300 as in-situ process sequences. It should be also noticed that the structure of the surface treating unit 330 (including the surface treating vapor supply 332) is similar to that of the drying unit 350 (including the drying vapor supply 352); and the structure of the surface treating unit 330 (including the surface treating solution supply 332 and spray nozzles 334) is similar to that of the cleaning unit 340 (including the cleaning solution supply 342 and cleaning nozzles 344). Therefore, it is convenient to retrofit any one of the drying units 350 of the chemical mechanical polishing tool 300 into the surface treating unit 330 (which includes the surface treating vapor supply 332) by replace the source of the drying vapor 354 with the source of the surface treating vapor 216. Similarly, it is also convenient to retrofit any one of the cleaning unit 340 of the chemical mechanical polishing tool 300 into the surface treating unit 330 (which includes the surface treating solution supply 332 and spray nozzles 334) by replace the source of the cleaning solution 246 with the source of the surface treating solution 214.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method fabricating a semiconductor device, the method comprising:
providing a semiconductor substrate;
depositing a dielectric layer over the semiconductor substrate; forming at least one trench in the dielectric layer; forming a metallization layer in the trench and over the dielectric layer; forming a protection layer, wherein forming the protection layer includes; performing a chemical mechanical polishing, process to planarize the metallization layer and the dielectric layer; and
dispersing a surface treating solution containing, trimethylsilyl group on the planarized dielectric layer and the metallization layer to form the protection layer on the dielectric layer, wherein a top surface of the metallization layer is exposed;
cleaning the planarized metallization layer and the treated planarized dielectric layer to remove residue from the chemical mechanical polishing process by a base solution; and
drying the cleaned planarized metallization layer and dielectric layer in an inert gas environment.

2. The method of claim 1, wherein the dielectric layer is a low-k dielectric layer.

3. The method of claim 2, wherein the low-k dielectric layer is formed from porous carbon-doped silicon dioxide and the protection layer is a pore-sealing layer.

4. The method of claim 1, wherein the base solution is an aqueous solution of KOH, NaOH or a mixture thereof.

5. The method of claim 1, after the operation of depositing a dielectric layer over the substrate, further comprising:
forming at least one via in the dielectric layer,
wherein the metallization layer is formed in the trench, the via and over the dielectric layer.

6. The method of claim 5, wherein the operation of forming at least one via and the operation of forming at least one trench in the dielectric layer are performed simultaneously by double patterning.

7. The method of claim 5, wherein the operation of forming at least one via is performed before the operation of forming at least one trench.

8. The method of claim 5, wherein the operation of forming at least one via is performed after the operation of forming at least one trench.

9. The method of claim 1, wherein the surface treating solution comprises N,N-Diethyl-1,1,1-trimethylsilylamine (TMSDEA), trimethylsilylacetate (OTMSA), or a mixture thereof.

10. The method of claim 1, wherein metallization layer is formed from copper, aluminum, tungsten, or an alloy thereof.

11. The method of claim 10, wherein metallization layer is formed from copper.

12. The method of claim 1, wherein the inert gas is comprised of nitrogen, helium, argon, or a mixture thereof.

13. The method of claim 1, wherein forming the metallization layer is performed by deposition.

14. The method of claim 13, wherein the deposition is chemical vapor deposition, plasma vapor deposition or electrochemical plating.

15. The method of claim 1, wherein drying the cleaned metallization layer and dielectric layer is performed by injecting an inert gas vapor to the cleaned metallization layer and dielectric layer in the inert gas environment.

* * * * *